United States Patent
Okamoto et al.

(10) Patent No.: US 11,091,663 B2
(45) Date of Patent: Aug. 17, 2021

(54) METHOD FOR PRODUCING DISPERSION LIQUID CONTAINING SILVER NANOPARTICLES, AND DISPERSION LIQUID CONTAINING SILVER NANOPARTICLES

(71) Applicant: DAICEL CORPORATION, Osaka (JP)

(72) Inventors: Kazuki Okamoto, Himeji (JP); Yuki Iguchi, Himeji (JP)

(73) Assignee: DAICEL CORPORATION, Osaka (JP)

( * ) Notice: Subject to any disclaimer, the term of this patent is extended or adjusted under 35 U.S.C. 154(b) by 0 days.

(21) Appl. No.: 15/030,816

(22) PCT Filed: Oct. 1, 2014

(86) PCT No.: PCT/JP2014/076270
§ 371 (c)(1),
(2) Date: Apr. 20, 2016

(87) PCT Pub. No.: WO2015/060084
PCT Pub. Date: Apr. 30, 2015

(65) Prior Publication Data
US 2016/0264810 A1    Sep. 15, 2016

(30) Foreign Application Priority Data

Oct. 24, 2013 (JP) .............................. JP2013-221420

(51) Int. Cl.
| | | |
|---|---|---|
| H01B 1/22 | (2006.01) |
| B22F 1/00 | (2006.01) |
| C09D 11/36 | (2014.01) |
| C09D 11/52 | (2014.01) |
| C09D 11/322 | (2014.01) |
| B22F 9/30 | (2006.01) |
| H05K 1/09 | (2006.01) |
| H01L 21/28 | (2006.01) |
| H01L 21/288 | (2006.01) |
| B82Y 40/00 | (2011.01) |

(Continued)

(52) U.S. Cl.
CPC ............ *C09D 11/52* (2013.01); *B22F 1/0022* (2013.01); *B22F 1/0062* (2013.01); *B22F 1/0074* (2013.01); *B22F 9/30* (2013.01); *C09D 11/322* (2013.01); *C09D 11/36* (2013.01); *H01B 1/22* (2013.01); *H01L 21/288* (2013.01); *H01L 21/28079* (2013.01); *H05K 1/097* (2013.01); *B41J 2/01* (2013.01); *B82Y 30/00* (2013.01); *B82Y 40/00* (2013.01); *H05K 2201/0224* (2013.01)

(58) Field of Classification Search
CPC . H01B 1/20; H01B 1/22; H05K 1/092; H05K 1/097; H05K 3/12; H05K 3/1283; C09D 11/52; C09D 11/36; B22F 1/0018; B22F 1/0022; B22F 1/0062; B22F 1/0074
See application file for complete search history.

(56) References Cited

U.S. PATENT DOCUMENTS

| | | | |
|---|---|---|---|
| 7,270,694 B2 * | 9/2007 | Li .......................... | B22F 1/0018 75/351 |
| 7,390,440 B2 * | 6/2008 | Hirakoso .............. | B22F 1/0059 174/126.4 |

(Continued)

FOREIGN PATENT DOCUMENTS

| | | |
|---|---|---|
| JP | 2008-214695 A | 9/2008 |
| JP | 2010-265543 A | 11/2010 |

(Continued)

OTHER PUBLICATIONS

Aliphatic compounds. IUPAC. Compendium of Chemical Terminology, 2nd ed. (the "Gold Book"). Compiled by A. D. McNaught and A. Wilkinson. Blackwell Scientific Publications, Oxford. (Year: 1997).*

(Continued)

*Primary Examiner* — Matthew R Diaz
(74) *Attorney, Agent, or Firm* — Birch, Stewart, Kolasch & Birch, LLP

(57) ABSTRACT

The present invention provides a dispersion liquid containing silver nano-particles that develops excellent conductivity by low-temperature calcining and has silver nano-particles stably and well dispersed in a dispersion solvent, and a method for producing the dispersion liquid containing silver nano-particles. [solution] A method for producing a dispersion liquid containing silver nano-particles, comprising: mixing a silver compound with amines comprising an aliphatic monoamine (A) comprising an aliphatic hydrocarbon group and one amino group, said hydrocarbon group having 6 or more carbon atoms in total; and further comprising at least one of: an aliphatic monoamine (B) comprising an aliphatic hydrocarbon group and one amino group, said hydrocarbon group having 5 or less carbon atoms in total; and an aliphatic diamine (C) comprising an aliphatic hydrocarbon group and two amino groups, said hydrocarbon group having 8 or less carbon atoms in total; to form a complex compound comprising the silver compound and the amines; thermally decomposing the complex compound by heating to form silver nano-particles; and dispersing the silver nano-particles in a dispersion solvent containing an alcohol-based solvent and an aliphatic hydrocarbon-based solvent in a specific ratio.

8 Claims, 4 Drawing Sheets

(51) Int. Cl.
*B82Y 30/00* (2011.01)
*B41J 2/01* (2006.01)

(56) References Cited

U.S. PATENT DOCUMENTS

| | | | | |
|---|---|---|---|---|
| 8,043,535 B2* | 10/2011 | Kamikoriyama | ...... | C09D 11/52 106/31.92 |
| 2009/0148600 A1* | 6/2009 | Li | ......... | B22F 1/0022 427/256 |
| 2009/0214764 A1* | 8/2009 | Li | ......... | B22F 1/0022 427/98.4 |
| 2010/0037731 A1* | 2/2010 | Li | ............ | B22F 9/24 75/370 |
| 2010/0143591 A1* | 6/2010 | Wu | ......... | C09D 11/52 427/256 |
| 2012/0043510 A1* | 2/2012 | Kurihara | ......... | H01B 1/22 252/514 |
| 2013/0334470 A1 | 12/2013 | Kurihara et al. | | |
| 2014/0346412 A1 | 11/2014 | Okamoto et al. | | |
| 2014/0374670 A1* | 12/2014 | Mokhtari | ........ | C09D 11/52 252/514 |
| 2015/0001452 A1 | 1/2015 | Kurihara et al. | | |
| 2015/0225588 A1 | 8/2015 | Iguchi et al. | | |

FOREIGN PATENT DOCUMENTS

| | | |
|---|---|---|
| JP | 2012-52225 A | 3/2012 |
| JP | 2012-162767 A | 8/2012 |
| JP | 2013-142172 A | 7/2013 |
| JP | 2013-142173 A | 7/2013 |
| WO | WO 2005/092286 A2 | 10/2005 |
| WO | WO 2012/105682 A1 | 8/2012 |
| WO | WO 2013/105530 A1 | 7/2013 |
| WO | WO 2013/105531 A1 | 7/2013 |
| WO | WO 2014/021270 A1 | 2/2014 |

OTHER PUBLICATIONS

Extended European Search Report for Application No. 14855617.8, dated Apr. 10, 2017.
Japanese Notification of Reasons for Refusal for Application No. 2015-543772, dated Apr. 5, 2016, with English language translation.
International Search Report for PCT/JP2014/076270 dated Dec. 16, 2014.
Written Opinion of the International Searching Authority for PCT/JP2014/076270 dated Dec. 16, 2014.
International Preliminary Report on Patentability and English translation of Written Opinion dated May 6, 2016, in PCT International Application No. PCT/JP2014/076270.
European Search Report for Appl. No. 18163367.8 dated Jun. 6, 2018.

* cited by examiner

Example 2
Initial ejection state

Example 2
Ejection state after
5 minute-intermittent
standing

Example 3
Ejection state after
5 minute-intermittent
standing

METHOD FOR PRODUCING DISPERSION LIQUID CONTAINING SILVER NANOPARTICLES, AND DISPERSION LIQUID CONTAINING SILVER NANOPARTICLES

TECHNICAL FIELD

The present invention relates to a method for producing a dispersion liquid containing silver nanoparticles, and a dispersion liquid containing silver nanoparticles. The present invention is applied also to a method for producing a dispersion liquid containing metal nanoparticles containing a metal other than silver, and said dispersion liquid containing metal nanoparticles.

BACKGROUND ART

Silver nano-particles can be sintered even at a low temperature. Utilizing this property, a silver coating composition containing silver nano-particles is used to form electrodes or conductive circuit patterns on a substrate in production of various electronic devices. Silver nano-particles are usually dispersed in an organic solvent. Silver nano-particles have an average primary particle diameter of about several nanometers to about several tens of nanometers, and their surfaces are usually coated with an organic stabilizer (protective agent). When the substrate is a plastic film or sheet, silver nano-particles need to be sintered at a low temperature (e.g., at 200° C. or less) less than a heat resistant temperature of the plastic substrate.

Particularly, attempts have been recently made to form fine metal lines (e.g., silver lines) not only on heat-resistant polyimide substrates that are already in use as substrates for flexible printed circuit boards but also on substrates made of various plastics, such as PET (polyethylene terephthalate) and polypropylene, that have lower heat resistance than polyimide but can be easily processed and are cheap. When plastic substrates having low heat resistance are used, metal nano-particles (e.g., silver nano-particles) need to be sintered at a lower temperature.

For example, JP-A-2008-214695 discloses a method for producing silver ultrafine particles, comprising reacting silver oxalate and oleylamine to form a complex compound containing at least silver, oleylamine, and an oxalate ion; and thermally decomposing the formed complex compound to form silver ultrafine particles (claim 1). Further, JP-A-2008-214695 discloses that in the above method, a saturated aliphatic amine having 1 to 18 carbon atoms in total is reacted in addition to the silver oxalate and the oleylamine (claims 2 and 3), so that a complex compound can be easily formed, the time required to produce silver ultrafine particles can be reduced, and the silver ultrafine particles protected by these amines can be formed in higher yield (paragraph [0011]).

JP-A-2010-265543 discloses a method for producing coated silver ultrafine particles, comprising the first step of mixing a silver compound that is decomposed by heating to generate metallic silver, a mid- to short-chain alkylamine having a boiling point of 100° C. to 250° C., and a mid- to short-chain alkyldiamine having a boiling point of 100° C. to 250° C. to prepare a complex compound containing the silver compound, the alkylamine, and the alkyldiamine; and the second step of thermally decomposing the complex compound (claim 3, paragraphs [0061] and [0062]).

JP-A-2012-162767 discloses a manufacturing method of coated metal fine particles comprising: a first step of mixing an amine liquid mixture of an alkylamine having 6 or more carbon atoms and an alkylamine having 5 or less carbon atoms with a metal compound including a metal atom, thereby generating a complex compound including the metal compound and amines; and a second step of heating and decomposing the complex compound, thereby generating metal fine particles (claim 1). JP-A-2012-162767 also discloses that coated silver fine particles can be dispersed in an organic solvent, such as an alcohol solvent such as butanol, a non-polar solvent such as octane, or a solvent mixture thereof (paragraph [0079]).

JP-A-2013-142172 discloses a method for producing silver nano-particles comprising:
preparing an amine mixture liquid comprising:
an aliphatic hydrocarbon monoamine (A) comprising an aliphatic hydrocarbon group and one amino group, said aliphatic hydrocarbon group having 6 or more carbon atoms in total;
an aliphatic hydrocarbon monoamine (B) comprising an aliphatic hydrocarbon group and one amino group, said aliphatic hydrocarbon group having 5 or less carbon atoms in total; and
an aliphatic hydrocarbon diamine (C) comprising an aliphatic hydrocarbon group and two amino groups, said aliphatic hydrocarbon group having 8 or less carbon atoms in total;
mixing a silver compound and the amine mixture liquid to form a complex compound comprising the silver compound and the amines; and
thermally decomposing the complex compound by heating to form silver nano-particles (claim 1). JP-A-2013-142172 also discloses that a silver coating composition called "silver ink" can be prepared by dispersing the obtained silver nano-particles in suspension state in an appropriate organic solvent (dispersion medium). JP-A-2013-142172 discloses, as the organic solvent, aliphatic hydrocarbon solvents such as pentane, hexane, heptane, octane, nonane, decane, undecane, dodecane, tridecane, and tetradecane; aromatic hydrocarbon solvents such as toluene, xylene, and mesitylene; and alcohol solvents such as methanol, ethanol, propanol, n-butanol, n-pentanol, n-hexanol, n-heptanol, n-octanol, n-nonanol, and n-decanol (paragraph [0085]).

JP-A-2013-142173 discloses a method for producing silver nano-particles comprising:
preparing an amine mixture liquid comprising:
an aliphatic hydrocarbon monoamine (A) comprising an aliphatic hydrocarbon group and one amino group, said aliphatic hydrocarbon group having 6 or more carbon atoms in total; and
an aliphatic hydrocarbon monoamine (B) comprising an aliphatic hydrocarbon group and one amino group, said aliphatic hydrocarbon group having 5 or less carbon atoms in total, in a specific ratio;
mixing a silver compound and the amine mixture liquid to form a complex compound comprising the silver compound and the amines; and
thermally decomposing the complex compound by heating to form silver nano-particles (claim 1). In the same way as JP-A-2013-142172, JP-A-2013-142173 also discloses that a silver coating composition called "silver ink" can be prepared by dispersing the obtained silver nano-particles in suspension state in an appropriate organic solvent (dispersion medium), and discloses the same organic solvents as in JP-A-2013-142172 (paragraph [0076]).

PRIOR ART DOCUMENTS

Patent Documents

Patent Document 1: JP-A-2008-214695
Patent Document 2: JP-A-2010-265543
Patent Document 3: JP-A-2012-162767
Patent Document 4: JP-A-2013-142172
Patent Document 5: JP-A-2013-142173

SUMMARY OF THE INVENTION

Problems to be Solved by the Invention

Silver nano-particles have an average primary particle diameter of about several nanometers to about several tens of nanometers, and are more likely to agglomerate than micron (μm)-size particles. Therefore, the reduction reaction of a silver compound (thermal decomposition reaction in the above patent documents) is performed in the presence of an organic stabilizer (protective agent such as an aliphatic amine or an aliphatic carboxylic acid) so that the surfaces of resulting silver nano-particles are coated with the organic stabilizer.

Meanwhile, silver nano-particles are used in a silver coating composition (silver ink or silver paste) in which the particles are contained in an organic solvent. In order to develop conductivity, an organic stabilizer coating the silver nano-particles needs to be removed during calcining performed after application of the silver coating composition onto a substrate to sinter the silver particles. When the temperature of the calcining is low, the organic stabilizer is poorly removed. When the silver particles are not sufficiently sintered, a low resistance value cannot be achieved. That is, the organic stabilizer present on the surfaces of the silver nano-particles contributes to the stabilization of the silver nano-particles, but on the other hand, interferes with the sintering of the silver nano-particles (especially, sintering by low-temperature calcining).

The use of an aliphatic amine compound and/or an aliphatic carboxylic acid compound each having a relatively long chain (e.g., 8 or more carbon atoms) as an organic stabilizer makes it easy to stabilize silver nano-particles because it is easy to ensure space between the silver nano-particles. On the other hand, the long-chain aliphatic amine compound and/or the long-chain aliphatic carboxylic acid compound are/is poorly removed when the temperature of calcining is low.

As described above, the relationship between the stabilization of silver nano-particles and the development of a low resistance value by low-temperature calcining is a trade-off.

As described above, in JP-A-2008-214695, oleylamine having 18 carbon atoms and a saturated aliphatic amine having 1 to 18 carbon atoms are used in combination as aliphatic amine compounds. However, the use of oleylamine as a main ingredient of a protective agent inhibits sintering of silver nano-particles during low-temperature calcining. Further, the reaction rate of forming a complex compound of oleylamine and silver oxalate is not satisfactory.

As described above, in JP-A-2010-265543, a mid- to short-chain alkylamine having a boiling point of 100° C. to 250° C. (paragraph [0061]) and a mid- to short-chain alkyldiamine having a boiling point of 100° C. to 250° C. (paragraph [0062]) are used in combination as aliphatic amine compounds. This method improves the problem resulting from the use of oleylamine as a main ingredient of a protective agent.

However, in JP-A-2010-265543, since the mid- to short-chain alkylamine and the mid- to short-chain alkyldiamine are used as a protective agent, dispersibility of resulting silver nano-particles in an organic solvent is lower than that when long-chain oleylamine is used as a main ingredient of a protective agent. The same matter is true in JP-A-2012-162767.

As described above, silver nanoparticle-containing ink has not been so far developed, which is capable of achieving sintering of silver nano-particles during low-temperature calcining and has silver nano-particles stably and well dispersed in an organic solvent.

Further, in view of ink-jet printing, silver nanoparticle-containing ink needs to be ink that causes no clogging of ink-jet heads.

Further, a thin film transistor (TFT) has recently been applied to a liquid crystal display (LCD), and a gate electrode of TFT is required to have surface smoothness. When used as a gate electrode of TFT, a coating film obtained by calcining silver nano-particles needs to have surface smoothness. In order to form a calcined coating film excellent in surface smoothness, silver nanoparticle-containing ink is required in which silver nano-particles are dispersed very stably in an organic solvent. A calcined silver coating film excellent in surface smoothness is sometimes required for applications other than a gate electrode of TFT.

It is therefore an object of the present invention to provide a dispersion liquid containing silver nano-particles that develops excellent conductivity (low resistance value) by low-temperature and short-time calcining and has silver nano-particles stably and well dispersed in a dispersion solvent, and a method for producing the dispersion liquid containing silver nano-particles. It is also an object of the present invention to provide a dispersion liquid containing silver nano-particles suitable for various printing applications, especially for ink-jet applications, and a method for producing the dispersion liquid containing silver nano-particles. Particularly, it is an object of the present invention to provide a dispersion liquid containing silver nano-particles capable of forming a calcined silver coating film excellent in surface smoothness, and a method for producing the dispersion liquid containing silver nano-particles.

Means for Solving the Problems

The present inventors have found that the above object can be achieved by dispersing, in a mixed dispersion solvent containing an alcohol-based solvent and an aliphatic hydrocarbon-based solvent in a specific ratio, silver nano-particles prepared by a so-called thermal decomposition method using aliphatic amine compounds having a relatively short carbon chain as a complex-forming agent and/or a protective agent.

The present invention includes the following aspects.

(1) A method for producing a dispersion liquid containing silver nano-particles, comprising:

mixing a silver compound with amines comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the silver compound and the amines;

thermally decomposing the complex compound by heating to form silver nano-particles; and dispersing the silver nano-particles in a dispersion solvent containing 50 to 90% by weight of an alcohol-based solvent and 10 to 50% by weight of an aliphatic hydrocarbon-based solvent.

(2) The method for producing a dispersion liquid containing silver nano-particles according to the above (1), wherein the silver compound is silver oxalate.

(3) The method for producing a dispersion liquid containing silver nano-particles according to the above (1) or (2), wherein the alcohol-based solvent is selected from the group consisting of a linear alcohol, a branched alcohol, and a ring structure-containing alcohol.

The method for producing a dispersion liquid containing silver nano-particles according to any one of the above, wherein the alcohol-based solvent is an aliphatic alcohol having 4 or more carbon atoms.

(4) The method for producing a dispersion liquid containing silver nano-particles according to the above (3), wherein the ring structure-containing alcohol contains a six-membered ring structure.

(5) The method for producing a dispersion liquid containing silver nano-particles according to any one of the above (1) to (4), wherein the aliphatic hydrocarbon solvent is selected from the group consisting of a linear hydrocarbon, a branched hydrocarbon, and a ring structure-containing hydrocarbon.

(6) The method for producing a dispersion liquid containing silver nano-particles according to any one of the above (1) to (5), wherein the ring structure-containing hydrocarbon contains a six-membered ring structure.

The method for producing a dispersion liquid containing silver nano-particles according to any one of the above, wherein the amines comprise the aliphatic hydrocarbon monoamine (A) and the aliphatic hydrocarbon monoamine (B).

The method for producing a dispersion liquid containing silver nano-particles according to any one of the above, wherein the amines comprise the aliphatic hydrocarbon monoamine (A) and the aliphatic hydrocarbon diamine (C).

The method for producing a dispersion liquid containing silver nano-particles according to any one of the above, wherein the amines comprise the aliphatic hydrocarbon monoamine (A), the aliphatic hydrocarbon monoamine (B), and the aliphatic hydrocarbon diamine (C).

The method for producing a dispersion liquid containing silver nano-particles according to any one of the above, wherein in the step of forming a complex compound comprising the silver compound and the amines, an aliphatic carboxylic acid is also used in addition to the amines.

(7) The method for producing a dispersion liquid containing silver nano-particles according to any one of the above (1) to (6), wherein the aliphatic hydrocarbon monoamine (A) is an alkylmonoamine having 6 or more and 12 or less carbon atoms.

(8) The method for producing a dispersion liquid containing silver nano-particles according to any one of the above (1) to (7), wherein the aliphatic hydrocarbon monoamine (B) is an alkylmonoamine having 2 or more and 5 or less carbon atoms.

(9) The method for producing a dispersion liquid containing silver nano-particles according to any one of the above (1) to (8), wherein the aliphatic hydrocarbon diamine (C) is an alkylenediamine in which one of the two amino groups is a primary amino group, and the other is a tertiary amino group.

(10) The method for producing a dispersion liquid containing silver nano-particles according to any one of the above (1) to (9), wherein the aliphatic amines are used in an amount of 1 to 50 moles as a total of the monoamine (A), the monoamine (B) and the diamine (C) per 1 mole of silver atoms in the silver compound.

A molecule of silver oxalate contains two silver atoms. The method for producing a dispersion liquid containing silver nano-particles according to any one of the above (1) to (9), wherein when the silver compound is silver oxalate, the aliphatic amines are used in an amount of 2 to 100 moles as a total of the monoamine (A), the monoamine (B) and the diamine (C) per 1 mole of silver oxalate.

A dispersion liquid containing silver nano-particles comprising silver nano-particles and a dispersion solvent, which is produced by the method according to any one of the above (1) to (10).

A dispersion liquid containing silver nano-particles comprising silver nano-particles and a dispersion solvent that disperses the silver nano-particles, wherein the silver nano-particles are formed by:

mixing a silver compound with amines comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the silver compound and the amines; and thermally decomposing the complex compound by heating; and wherein the dispersion solvent contains 50 to 90% by weight of an alcohol-based solvent and 10 to 50% by weight of an aliphatic hydrocarbon-based solvent.

The silver compound is preferably silver oxalate.

(11) A dispersion liquid containing silver nano-particles comprising silver nano-particles whose surfaces are coated with a protective agent, and a dispersion solvent that disperses the silver nano-particles, wherein the protective agent comprises an aliphatic hydrocarbon monoamine (A) comprising an aliphatic hydrocarbon group and one amino group, said aliphatic hydrocarbon group having 6 or more carbon atoms in total; and further comprises at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; and wherein the dispersion solvent contains 50 to 90% by weight of an alcohol-based solvent and 10 to 50% by weight of an aliphatic hydrocarbon-based solvent.

(12) The dispersion liquid containing silver nano-particles according to the above (11), wherein the alcohol-based solvent is selected from the group consisting of a linear alcohol, a branched alcohol, and a ring structure-containing alcohol.

The dispersion liquid containing silver nano-particles according to any one of the above, wherein the alcohol-based solvent is an aliphatic alcohol having 4 or more carbon atoms.

(13) The dispersion liquid containing silver nano-particles according to the above (12), wherein the ring structure-containing alcohol contains a six-membered ring structure.

(14) The dispersion liquid containing silver nano-particles according to any one of the above (11) to (13), wherein the aliphatic hydrocarbon solvent is selected from the group consisting of a linear hydrocarbon, a branched hydrocarbon, and a ring structure-containing hydrocarbon.

(15) The dispersion liquid containing silver nano-particles according to the above (14), wherein the ring structure-containing hydrocarbon contains a six-membered ring structure.

(16) The dispersion liquid containing silver nano-particles according to any one of the above (11) to (15), wherein the silver nano-particles are contained in an amount of 10% by weight or more.

(17) The dispersion liquid containing silver nano-particles according to any one of the above (11) to (16), which is used as ink for printing.

Silver ink for printing, comprising the dispersion liquid containing silver nano-particles according to any one of the above (11) to (16).

(18) The dispersion liquid containing silver nano-particles according to any one of the above (11) to (16), which is used as ink for ink-jet printing.

Silver ink for ink-jet printing, comprising the dispersion liquid containing silver nano-particles according to any one of the above (11) to (16).

A silver conducive material comprising:
a substrate; and
a silver conductive layer obtained by applying, onto the substrate, a dispersion liquid containing silver nano-particles produced by the method according to any one of the above or the dispersion liquid containing silver nano-particles according to any one of the above to form a coating layer, and calcining the coating layer.

The silver conductive layer may be patterned.

The calcining is performed at a temperature of 200° C. or less, for example, 150° C. or less, preferably 120° C. or less, for 2 hours or less, for example, 1 hour or less, preferably 30 minutes or less, more preferably 15 minutes or less. More specifically, the calcining is performed under conditions of about 90° C. to 120° C. and about 10 minutes to 15 minutes, for example, 120° C. and 15 minutes. The calcined silver conductive layer has a surface roughness Ra of, for example, 0.03 µm or less.

A method for producing a silver conductive material, comprising:
applying, onto a substrate, a dispersion liquid containing silver nano-particles produced by the method according to any one of the above or the dispersion liquid containing silver nano-particles according to any one of the above to form a coating layer containing silver nano-particles, and then,
calcining the coating layer to form a silver conductive layer.

The dispersion liquid containing silver nano-particles may be applied in a pattern to form a patterned silver conductive layer.

The calcining is performed at a temperature of 200° C. or less, for example, 150° C. or less, preferably 120° C. or less, for 2 hours or less, for example, 1 hour or less, preferably 30 minutes or less, more preferably 15 minutes or less. More specifically, the calcining is performed under conditions of about 90° C. to 120° C. and about 10 minutes to 15 minutes, for example, 120° C. and 15 minutes. The calcined silver conductive layer has a surface roughness Ra of, for example, 0.03 µm or less.

A silver conductive layer formed by applying, onto a substrate, the dispersion liquid containing nano-particles to form a coating layer containing silver nano-particles, and then calcining the coating layer, wherein the silver conductive layer has a surface roughness Ra of 0.03 µm or less. The silver conductive layer can have a surface roughness Ra of 0.03 µm or less without being subjected to smoothing treatment after calcining.

(19) An electronic device comprising a silver conductive layer formed by application and calcining of a dispersion liquid containing silver nano-particles produced by the method according to any one of the above or the dispersion liquid containing silver nano-particles according to any one of the above. Examples of the electronic device include various circuit boards and modules.

A method for producing a dispersion liquid containing metal nano-particles, comprising:
mixing a metal compound with amines comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the metal compound and the amines;
thermally decomposing the complex compound by heating to form metal nano-particles; and
dispersing the metal nano-particles in a dispersion solvent containing 50 to 90% by weight of an alcohol-based solvent and 10 to 50% by weight of an aliphatic hydrocarbon-based solvent.

A dispersion liquid containing metal nano-particles comprising metal nano-particles and a dispersion solvent that disperses the metal nano-particles, wherein
the metal nano-particles are formed by:
mixing a metal compound with amines comprising an aliphatic hydrocarbon monoamine (A) comprising an aliphatic hydrocarbon group and one amino group, said aliphatic hydrocarbon group having 6 or more carbon atoms in total; and further comprising at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; to form a complex compound comprising the metal compound and the amines; and
thermally decomposing the complex compound by heating; and wherein
the dispersion solvent contains 50 to 90% by weight of an alcohol-based solvent and 10 to 50% by weight of an aliphatic hydrocarbon-based solvent.

A dispersion liquid containing metal nano-particles comprising metal nano-particles whose surfaces are coated with a protective agent and a dispersion solvent that disperses the metal nano-particles, wherein the protective agent comprises an aliphatic hydrocarbon monoamine (A) comprising an aliphatic hydrocarbon group and one amino group, said aliphatic hydrocarbon group having 6 or more carbon atoms in total; and further comprises at least one of: an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total; and wherein the dispersion solvent contains 50 to 90% by weight of an alcohol-based solvent and 10 to 50% by weight of an aliphatic hydrocarbon-based solvent.

Metal ink for printing, comprising the dispersion liquid containing metal nano-particles according to any one of the above.

Metal ink for ink-jet printing, comprising the dispersion liquid containing metal nano-particles according to any one of the above.

Effects of the Invention

In the present invention, as aliphatic amine compounds that function as a complex-forming agent and/or a protective agent, an aliphatic hydrocarbon monoamine (A) having 6 or more carbon atoms in total, and at least one of an aliphatic hydrocarbon monoamine (B) having 5 or less carbon atoms in total and an aliphatic hydrocarbon diamine (C) having 8 or less carbon atoms in total are used, and, silver nano-particles whose surfaces are coated with these aliphatic amine compounds are formed.

The aliphatic hydrocarbon monoamine (B) and the aliphatic hydrocarbon diamine (C) each have a short carbon chain, and are therefore easily removed from the surfaces of the silver particles in a short time of 2 hours or less, for example, 1 hour or less, preferably 30 minutes or less even by low-temperature calcining at a temperature of 200° C. or less, for example, 150° C. or less, preferably 120° C. or less. In addition, the presence of the monoamine (B) and/or the diamine (C) reduces the amount of the aliphatic hydrocarbon monoamine (A) adhered to the surfaces of the silver particles. This makes it possible to easily remove these aliphatic amine compounds from the surfaces of the silver particles in such a short time as described above even by low-temperature calcining at such a low temperature as described above, thereby allowing the silver particles to be sufficiently sintered.

The silver nano-particles whose surfaces are coated with these aliphatic amine compounds are dispersed in a mixed dispersion solvent containing an alcohol-based solvent and an aliphatic hydrocarbon-based solvent in a specific ratio. The mixed dispersion solvent very stably disperses the silver nano-particles whose surfaces are coated with the aliphatic amine compounds having a short carbon chain.

As described above, according to the present invention, it is possible to provide a dispersion liquid containing silver nano-particles (silver ink) that develops excellent conductivity (low resistance value) by low-temperature and short-time calcining and has silver nano-particles dispersed very stably in a dispersion solvent, and a method for producing the dispersion liquid containing silver nano-particles. The dispersion liquid containing silver nano-particles (silver ink) according to the present invention is suitable for ink-jet applications. Further, according to the present invention, it is possible to provide a dispersion liquid containing silver nano-particles (silver ink) capable of forming a calcined silver coating film excellent in surface smoothness, and a method for producing the dispersion liquid containing silver nano-particles.

The present invention is also applied to a dispersion liquid containing metal nano-particles (metal ink) containing a metal other than silver, and a method for producing the dispersion liquid containing metal nano-particles.

According to the present invention, it is possible to form a conductive film or a conductive line excellent in surface smoothness even on any plastic substrate having low heat resistance such as a PET substrate or a polypropylene substrate. The dispersion liquid containing silver nano-particles (silver ink) according to the present invention is suitable for use in elements in recent various electronic devices.

MODES FOR CARRYING OUT THE INVENTION

Figure 1:
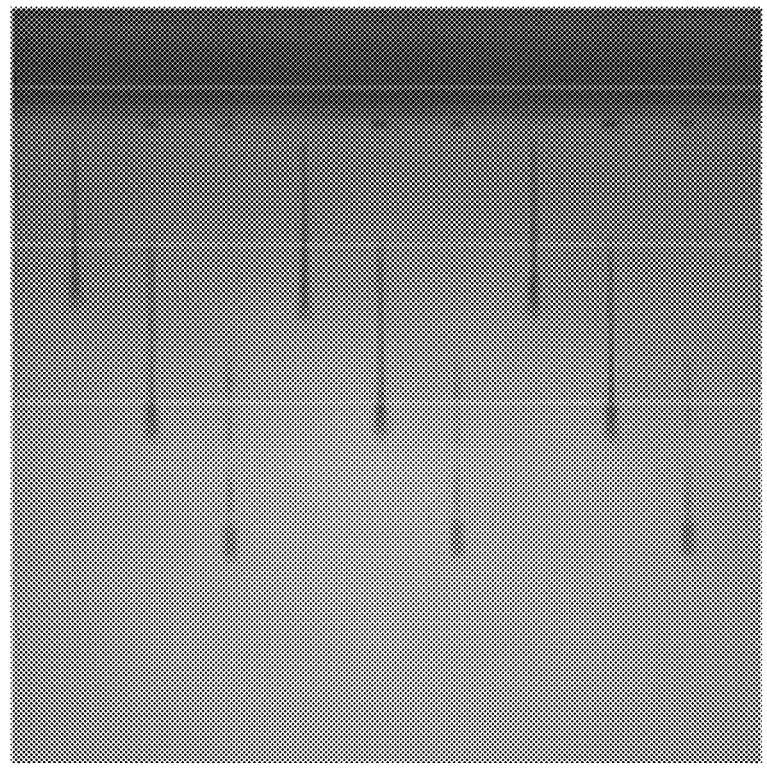
FIG. 1 is a photograph showing an ink-jet ejection state (initial ejection) of the silver nanoparticle ink obtained in Example 2.

In the present invention, first, silver nano-particles are formed.

In a method for forming silver nano-particles, first, an amine mixture liquid is prepared which comprises:

an aliphatic hydrocarbon monoamine (A) comprising an aliphatic hydrocarbon group and one amino group, said aliphatic hydrocarbon group having 6 or more carbon atoms in total; and further comprises at last one of:

an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total. Then, a silver compound and the amine mixture liquid are mixed with each other to form a complex compound comprising the silver compound and the amines. However, mixing of the silver compound and the amines does not necessarily need to be performed using the amines in a mixture state. The amines may be added sequentially to the silver compound.

Then, the complex compound is thermally decomposed by heating to form silver nano-particles. Thus, the method for producing silver nano-particles according to the present invention mainly includes a preparation step for an amine mixture liquid, a forming step of a complex compound, and a thermal-decomposition step of the complex compound.

In this description, the term "nano-particles" means that primary particles have a size (average primary particle diameter), which is measured by transmission electron microscope (TEM), of less than 1,000 nm. The particle size refers to the size of a particle not including a protective agent (a stabilizer) present on (coating) the surface of the particle (i.e., refers to the size of silver itself). In the present invention, the silver nano-particles have an average primary particle diameter of, for example, 0.5 nm to 100 nm, preferably 0.5 nm to 50 nm, more preferably 0.5 nm to 25 nm, even more preferably 0.5 nm to 20 nm.

The silver compound used in the present invention is one that is easily decomposed by heating to generate metallic silver. Examples of such a silver compound that can be used include: silver carboxylates such as silver formate, silver acetate, silver oxalate, silver malonate, silver benzoate, and silver phthalate; silver halides such as silver fluoride, silver chloride, silver bromide, and silver iodide; silver sulfate, silver nitrate, silver carbonate, and the like. In terms of the fact that metallic silver is easily generated by decomposition and impurities other than silver are less likely to be generated, silver oxalate is preferably used. Silver oxalate is advantageous in that silver oxalate has a high silver content, and metallic silver is directly obtained by thermal decomposition without the need for a reducing agent, and therefore impurities derived from a reducing agent are less likely to remain.

When metal nano-particles containing another metal other than silver are produced, a metal compound that is easily decomposed by heating to generate a desired metal is used instead of the silver compound. As such a metal compound, a metal salt corresponding to the above mentioned silver compound can be used. Examples of such a metal compound include: metal carboxylates; metal halides; and metal salt compounds such as metal sulfates, metal nitrates, and metal carbonates. Among them, in terms of the fact that a metal is easily generated by decomposition and impurities other than a metal are less likely to be generated, metal oxalate is preferably used. Examples of another metal include Al, Au, Pt, Pd, Cu, Co, Cr, In, and Ni.

Further, in order to obtain a composite with silver, the above mentioned silver compound and the above mentioned compound of another metal other than silver may be used in combination. Examples of another metal include Al, Au, Pt, Pd, Cu, Co, Cr, In, and Ni. The silver composite is composed of silver and one or more other metals, and examples thereof include Au—Ag, Ag—Cu, Au—Ag—Cu, Au—Ag—Pd, and the like. The amount of silver occupies at least 20% by weight, usually at least 50% by weight, for example, at least 80% by weight of the total amount of the metals.

In the present invention, as aliphatic hydrocarbon amine compounds that function as a complex-forming agent and/or a protective agent, an aliphatic hydrocarbon amine (A) having 6 or more carbon atoms in total, and further at least one of an aliphatic hydrocarbon amine (B) having 5 or less carbon atoms in total and an aliphatic hydrocarbon diamine (C) having 8 or less carbon atoms in total are used.

Although established, the "aliphatic hydrocarbon monoamine" in this description refers to a compound composed of one to three monovalent aliphatic hydrocarbon groups and one amino group. The "hydrocarbon group" refers to a group only composed of carbon and hydrogen. However, if necessary, each of the aliphatic hydrocarbon monoamine (A) and the aliphatic hydrocarbon monoamine (B) may have, on its hydrocarbon group, a substituent group containing a hetero atom (atom other than carbon and hydrogen) such as an oxygen atom or a nitrogen atom.

Further, the "aliphatic hydrocarbon diamine" refers to a compound composed of a bivalent aliphatic hydrocarbon group (alkylene group), two amino groups between which said aliphatic hydrocarbon group is interposed, and, if necessary, aliphatic hydrocarbon group(s) (alkyl group(s)) substituted for hydrogen atom(s) on the amino group(s). However, if necessary, the aliphatic hydrocarbon diamine (C) may have, on its hydrocarbon group, a substituent group containing a hetero atom (atom other than carbon and hydrogen) such as an oxygen atom or a nitrogen atom.

The aliphatic hydrocarbon monoamine (A) having 6 or more carbon atoms in total has, due to its hydrocarbon chain, high performance as a protective agent (a stabilizer) onto the surfaces of resulting silver particles.

The aliphatic hydrocarbon monoamine (A) includes a primary amine, a secondary amine, and a tertiary amine. Examples of the primary amine include saturated aliphatic hydrocarbon monoamines (i.e., alkylmonoamines) such as hexylamine, heptylamine, octylamine, nonylamine, decylamine, undecylamine, dodecylamine, tridecylamine, tetradecylamine, pentadecylamine, hexadecylamine, heptadecylamine, and octadecylamine. Examples of the saturated aliphatic hydrocarbon monoamine other than the above-mentioned linear aliphatic monoamines include branched aliphatic hydrocarbon amines such as isohexylamine, 2-ethylhexylamine, and tert-octylamine. Another example of the saturated aliphatic hydrocarbon monoamine includes cyclohexylamine. Other examples of the primary amine include unsaturated aliphatic hydrocarbon monoamines (i.e., alkenylmonoamines) such as oleylamine.

Examples of the secondary amine include dialkylmonoamines such as N,N-dipropylamine, N,N-dibutylamine, N,N-dipentylamine, N,N-dihexylamine, N,N-dipeptylamine, N,N-dioctylamine, N,N-dinonylamine, N,N-didecylamine, N,N-diundecylamine, N,N-didodecylamine, N-methyl-N-propylamine, N-ethyl-N-propylamine, and N-propyl-N-butylamine. Examples of the tertiary amine include tributylamine, trihexylamine, and the like.

Among them, saturated aliphatic hydrocarbon monoamines having 6 or more carbon atoms are preferred. When the number of carbon atoms is 6 or more, space can be secured between silver particles by adsorption of amino groups to the surfaces of the silver particles, thereby improving the effect of preventing agglomeration of the silver particles. The upper limit of the number of carbon atoms is not particularly limited, but saturated aliphatic monoamines having up to 18 carbon atoms are usually preferred in consideration of ease of availability, ease of removal during calcining, etc. Particularly, alkylmonoamines having 6 to 12 carbon atoms such as hexylamine, heptylamine, octylamine, nonylamine, decylamine, undecylamine, and dodecylamine are preferably used. The above-mentioned aliphatic hydrocarbon monoamines (A) may be used singly or in combination of two or more of them.

The aliphatic hydrocarbon monoamine (B) having 5 or less carbon atoms in total has a shorter carbon chain than the aliphatic monoamine (A) having 6 or more carbon atoms in total, and therefore the function of the aliphatic hydrocarbon monoamine (B) itself as a protective agent (a stabilizer) is considered to be low. However, the aliphatic hydrocarbon monoamine (B) has a high ability to coordinate to silver in the silver compound due to its higher polarity than the aliphatic monoamine (A), and is therefore considered to have the effect of promoting complex formation. In addition, the aliphatic hydrocarbon monoamine (B) has a short carbon chain, and therefore can be removed from the surfaces of silver particles in a short time of 30 minutes or less, or 20 minutes or less, even by low-temperature calcining at a temperature of, for example, 120° C. or less, or about 100° C. or less, which is effective for low-temperature calcining of resulting silver nano-particles.

Examples of the aliphatic hydrocarbon monoamine (B) include saturated aliphatic hydrocarbon monoamines (i.e., alkylmonoamines) having 2 to 5 carbon atoms such as ethylamine, n-propylamine, isopropylamine, n-butylamine, isobutylamine, sec-butylamine, tert-butylamine, pentylamine, isopentylamine, and tert-pentylamine. Other examples of the aliphatic hydrocarbon monoamine (B) include dialkylmonoamines such as N,N-dimethylamine and N,N-diethylamine.

Among them, n-butylamine, isobutylamine, sec-butylamine, tert-butylamine, pentylamine, isopentylamine, tert-pentylamine, and the like are preferred, and the above-mentioned butylamines are particularly preferred. The above-mentioned aliphatic hydrocarbon monoamines (B) may be used singly or in combination of two or more of them.

The aliphatic hydrocarbon diamine (C) having 8 or less carbon atoms in total has a high ability to coordinate to silver in the silver compound, and therefore has the effect of promoting complex formation. Generally, aliphatic hydrocarbon diamines have higher polarity than aliphatic hydrocarbon monoamines, and therefore have a high ability to coordinate to silver in a silver compound. Further, the aliphatic hydrocarbon diamine (C) has the effect of promoting lower-temperature and shorter-time thermal decomposition in the thermal-decomposition step of the complex compound, and therefore production of silver nano-particles can be more efficiently conducted. Further, a protective film containing the aliphatic diamine (C) on silver particles has high polarity, which improves the dispersion stability of the silver particles in a dispersion medium comprising a highly-polar solvent. Furthermore, the aliphatic diamine (C) has a short carbon chain, and therefore can be removed from the surfaces of silver particles in a short time of 30 minutes or less, or 20 minutes or less, even by low-temperature calcining at a temperature of, for example, 120° C. or less, or about 100° C. or less, which is effective for low-temperature and short-time calcining of resulting silver nano-particles.

The aliphatic hydrocarbon diamine (C) is not particularly limited, and examples thereof include ethylenediamine, N,N-dimethylethylenediamine, N,N'-dimethylethylenediamine, N,N-diethylethylenediamine, N,N'-diethylethylenediamine, 1,3-propanediamine, 2,2-dimethyl-1,3-propanediamine, N,N-dimethyl-1,3-propanediamine, N,N'-dimethyl-1,3-propanediamine, N,N-diethyl-1,3-propanediamine, N,N'-diethyl-1,3-propanediamine, 1,4-butanediamine, N,N-dimethyl-1,4-butanediamine, N,N'-dimethyl-1,4-butanediamine, N,N-diethyl-1,4-butanediamine, N,N'-diethyl-1,4-butanediamine, 1,5-pentanediamine, 1,5-diamino-2-methylpentane, 1,6-hexanediamine, N,N-dimethyl-1,6-hexanediamine, N,N'-dimethyl-1,6-hexanediamine, 1,7-heptanediamine, 1,8-octanediamine, and the like. They are all alkylenediamines having 8 or less carbon atoms in total in which at least one of the two amino groups is a primary amino group or a secondary amino group, and have a high ability to coordinate to silver in the silver compound, and therefore have the effect of promoting complex formation.

Among them, N,N-dimethylethylenediamine, N,N-diethylethylenediamine, N,N-dimethyl-1,3-propanediamine, N,N-diethyl-1,3-propanediamine, N,N-dimethyl-1,4-butanediamine, N,N-diethyl-1,4-butanediamine, N,N-dimethyl-1,6-hexanediamine, and the like are preferred, which are alkylenediamines having 8 or less carbon atoms in total in which one of the two amino groups is a primary amino group ($-NH_2$) and the other is a tertiary amino group ($-NR^1R^2$). Such preferred alkylenediamines are represented by the following structural formula:

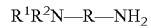

wherein R represents a bivalent alkylene group, $R^1$ and $R^2$ maybe the same or different from each other and each represent an alkyl group, and the total number of carbon atoms of R, $R^1$, and $R^2$ is 8 or less. The alkylene group does not usually contain a hetero atom (atom other than carbon and hydrogen) such as an oxygen atom or a nitrogen atom, but if necessary, may have a substituent group containing such a hetero atom. Further, the alkyl group does not usually contain a hetero atom such as an oxygen atom or a nitrogen atom, but if necessary, may have a substituent group containing such a hetero atom.

When one of the two amino groups is a primary amino group, the ability to coordinate to silver in the silver compound is high, which is advantageous for complex formation, and when the other is a tertiary amino group, a resulting complex is prevented from having a complicated network structure because a tertiary amino group has a poor ability to coordinate to a silver atom. If a complex has a complicated network structure, there is a case where the thermal-decomposition step of the complex requires a high temperature. Among these diamines, those having 6 or less carbon atoms in total are preferred, and those having 5 or less carbon atoms in total are more preferred in terms of the fact that they can be removed from the surfaces of silver particles in a short time even by low-temperature calcining. The above-mentioned aliphatic hydrocarbon diamines (C) may be used singly or in combination of two or more of them.

The ratio between the aliphatic hydrocarbon monoamine (A) having 6 or more carbon atoms in total, and one or both of the aliphatic hydrocarbon monoamine (B) having 5 or less carbon atoms in total and the aliphatic hydrocarbon diamine (C) having 8 or less carbon atoms in total used in the present invention is not particularly limited. For example, the amount of the aliphatic monoamine (A) may be 5 mol % to 65 mol %; and the total amount of the aliphatic monoamine (B) and the aliphatic diamine (C) may be 35 mol % to 95 mol %, on the basis of the total amount of the amines [(A)+(B)+(C)].

By setting the content of the aliphatic monoamine (A) to 5 mol % to 65 mol %, the carbon chain of the component (A) can easily fulfill its function of protecting and stabilizing the surfaces of resulting silver particles. If the content of the component (A) is less than 5 mol %, there is a case where the protective and stabilization function is poorly developed. On the other hand, if the content of the component (A) exceeds 65 mol %, the protective and stabilization function is sufficient, but the component (A) is poorly removed by low-temperature calcining.

When the aliphatic monoamine (A), and further both the aliphatic monoamine (B) and the aliphatic diamine (C) are used, the ratio among them used is not particularly limited. For example, the amount of the aliphatic monoamine (A) may be 5 mol % to 65 mol %;

the amount of the aliphatic monoamine (B) may be 5 mol % to 70 mol %; and the amount of the aliphatic diamine (C) maybe 5 mol % to 50 mol %, on the basis of the total amount of the amines [(A)+(B)+(C)].

In this case, the lower limit of the content of the component (A) is preferably 10 mol % or more, more preferably 20 mol % or more . The upper limit of the content of the component (A) is preferably 65 mol % or less, more preferably 60 mol % or less.

By setting the content of the aliphatic monoamine (B) to 5 mol % to 70 mol %, the effect of promoting complex formation is easily obtained, the aliphatic monoamine (B) itself can contribute to low-temperature and short-time calcining, and the effect of facilitating the removal of the aliphatic diamine (C) from the surfaces of silver particles during calcining is easily obtained. If the content of the component (B) is less than 5 mol %, there is a case where the effect of promoting complex formation is poor, or the component (C) is poorly removed from the surfaces of silver particles during calcining. On the other hand, if the content of the component (B) exceeds 70 mol %, the effect of promoting complex formation is obtained, but the content of the aliphatic monoamine (A) is relatively reduced so that the surfaces of resulting silver particles are poorly protected and stabilized. The lower limit of the content of the component (B) is preferably 10 mol % or more, more preferably 15 mol % or more. The upper limit of the content of the component (B) is preferably 65 mol % or less, more preferably 60 mol % or less.

By setting the content of the aliphatic diamine (C) to 5 mol % to 50 mol %, the effect of promoting complex formation and the effect of promoting the thermal-decomposition of the complex are easily obtained, and further, the dispersion stability of silver particles in a dispersion medium containing a highly-polar solvent is improved because a protective film containing the aliphatic diamine (C) on silver particles has high polarity. If the content of the component (C) is less than 5 mol %, there is a case where the effect of promoting complex formation and the effect of promoting the thermal-decomposition of the complex are poor. On the other hand, if the content of the component (C) exceeds 50 mol %, the effect of promoting complex formation and the effect of promoting the thermal-decomposition of the complex are obtained, but the content of the aliphatic monoamine (A) is relatively reduced so that the surfaces of resulting silver particles are poorly protected and stabilized. The lower limit of the content of the component (C) is preferably 5 mol % or more, more preferably 10 mol % or more. The upper limit of the content of the component (C) is preferably 45 mol % or less, more preferably 40 mol % or less.

When the aliphatic monoamine (A) and the aliphatic monoamine (B) are used (without using the aliphatic diamine (C)), the ratio between them used is not particularly limited. For example, in consideration of the above-described functions of these components,
the amount of the aliphatic monoamine (A) may be 5 mol % to 65 mol %; and
the amount of the aliphatic monoamine (B) may be 35 mol % to 95 mol %,
on the basis of the total amount of the amines [(A)+(B)].

When the aliphatic monoamine (A) and the aliphatic diamine (C) are used (without using the aliphatic monoamine (B)), the ratio between them used is not particularly limited. For example, in consideration of the above-described functions of these components,
the amount of the aliphatic monoamine (A) may be 5 mol % to 65 mol %; and
the amount of the aliphatic diamine (C) may be 35 mol % to 95 mol %,
on the basis of the total amount of the amines [(A)+(C)].

The above ratios among/between the aliphatic monoamine (A) and the aliphatic monoamine (B) and/or the aliphatic diamine (C) used are examples and may be changed in various manners.

In the present invention, the use of the aliphatic monoamine (B) and/or the aliphatic diamine (C) each having a high ability to coordinate to silver in the silver compound makes it possible, depending on their contents, to reduce the amount of the aliphatic monoamine (A) having 6 or more carbon atoms in total adhered to the surfaces of silver particles. Therefore, these aliphatic amine compounds are easily removed from the surfaces of silver particles even by the above-described low-temperature and short-time calcining so that the silver particles are sufficiently sintered.

In the present invention, the total amount of the amines [(A), (B) and/or (C)] is not particularly limited, but may be about 1 to 50 moles as the total amount of the amine components [(A)+(B)+(C)] per 1 mole of silver atoms in the silver compound as a starting material. If the total amount of the amine components [(A)+(B)+(C)] is less than 1 mole per 1 mole of the silver atoms, there is a possibility that part of the silver compound remains without being converted to a complex compound in the complex compound-forming step so that, in the subsequent thermal decomposition step, silver particles have poor uniformity and become enlarged or the silver compound remains without being thermally decomposed. On the other hand, it is considered that even when the total amount of the amine components [(A)+(B)+(C)] exceeds about 50 moles per 1 mole of the silver atoms, there are few advantages. In order to prepare a dispersion liquid of silver nano-particles in substantially the absence of solvent, the total amount of the amine components may be, for example, about 2 or more moles. By setting the total amount of the amine components to about 2 to 50 moles, the complex compound-forming step and the thermal-decomposition step of the complex compound can be successfully performed. The lower limit of the total amount of the amine components is preferably 2 moles or more, more preferably 6 moles or more per 1 mole of silver atoms in the silver compound. It is to be noted that the molecule of silver oxalate contains two silver atoms.

In the present invention, an aliphatic carboxylic acid (D) may further be used as a stabilizer to further improve the dispersibility of silver nano-particles in a dispersion medium. The aliphatic carboxylic acid (D) maybe used together with the above-described amines, and may be used by adding to the liquid amine mixture. The use of the aliphatic carboxylic acid (D) may improve the stability of silver nano-particles, especially the stability of silver nano-particles in a coating material state where the silver nano-particles are dispersed in an organic solvent.

As the aliphatic carboxylic acid (D), a saturated or unsaturated aliphatic carboxylic acid is used. Examples of the aliphatic carboxylic acid include saturated aliphatic monocarboxylic acids having 4 or more carbon atoms such as butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, and eicosenoic acid; and unsaturated aliphatic monocarboxylic acids having 8 or more carbon atoms such as oleic acid, elaidic acid, linoleic acid, and palmitoleic acid.

Among them, saturated or unsaturated aliphatic monocarboxylic acids having 8 to 18 carbon atoms are preferred. When the number of carbon atoms is 8 or more, space can be secured between silver particles by adsorption of carboxylic groups to the surfaces of the silver particles, thereby improving the effect of preventing agglomeration of the silver particles. In consideration of ease of availability, ease of removal during calcining, etc., saturated or unsaturated aliphatic monocarboxylic compounds having up to 18 carbon atoms are usually preferred. Particularly, octanoic acid, oleic acid, and the like are preferably used. The above-mentioned aliphatic carboxylic acids (D) may be used singly or in combination of two or more of them.

When the aliphatic carboxylic acid (D) is used, the amount of the aliphatic carboxylic acid (D) used may be, for example, about 0.05 to 10 moles, preferably 0.1 to 5 moles, more preferably 0.5 to 2 moles per 1 mole of silver atoms in the silver compound as a starting material. If the amount of the component (D) is less than 0.05 moles per 1 mole of the silver atoms, the effect of improving dispersion stability obtained by adding the component (D) is poor. On the other hand, if the amount of the component (D) reaches 10 moles, the effect of improving dispersion stability is saturated and the component (D) is poorly removed by low-temperature calcining. It is to be noted that the aliphatic carboxylic acid (D) does not necessarily need to be used.

In the present invention, an amine mixture liquid containing the aliphatic monoamine (A) and further one or both of the aliphatic monoamine (B) and the aliphatic diamine (C) is firstly prepared [preparation step for amine mixture liquid].

The amine mixture liquid can be prepared by stirring the amine component (A), the amine component (B) and/or the amine component (C), and if used, the carboxylic acid component (D) in a given ratio at a room temperature.

Then, the amine mixture liquid containing the amine component (A), the amine component (B), and the amine component (C) is mixed with the silver compound to form a complex compound containing the silver compound and the amines (complex compound-forming step). When metal nano-particles containing another metal other than silver are produced, a metal compound containing a desired metal is used instead of the silver compound.

The silver compound (or the metal compound) in powder form, and a given amount of the amine mixture liquid are mixed. At this time, the mixing may be performed by stirring them at a room temperature, or may be performed by stirring them while a mixture of them is appropriately cooled to a room temperature or less because the coordination reaction of the amines to the silver compound (or the metal compound) is accompanied by heat generation. The excess amines function as a reaction medium. When a complex compound is formed, the formed complex compound generally exhibits a color corresponding to its components, and therefore the endpoint of a complex compound-forming reaction can be determined by detecting the end of a change in the color of a reaction mixture by an appropriate spectroscopic method or the like. A complex compound formed from silver oxalate is generally colorless (appears white to our eyes), but even in such a case, it is possible to determine the state of formation of a complex compound based on a change in the form of a reaction mixture such as a change in viscosity. In this way, a silver-amine complex (or a metal-amine complex) is obtained in a medium mainly containing the amines.

Then, the obtained complex compound is thermally decomposed by heating to form silver nano-particles [thermal-decomposition step of complex compound]. When a metal compound containing another metal other than silver is used, desired metal nano-particles are formed. The silver nano-particles (metal nano-particles) are formed without using a reducing agent. However, if necessary, an appropriate reducing agent may be used without impairing the effects of the present invention.

In such a metal-amine complex decomposition method, the amines generally play a role in controlling the mode of formation of fine-particles by agglomeration of an atomic metal generated by decomposition of the metal compound, and in forming film on the surfaces of the formed metal fine-particles to prevent reagglomeration of the fine-particles. That is, it is considered that when the complex compound of the metal compound and the amine is heated, the metal compound is thermally decomposed to generate an atomic metal while the coordination bond of the amine to a metallic atom is maintained, and then the metallic atoms coordinated with the amine are agglomerated to form metal nano-particles coated with an amine protective film.

At this time, the thermal decomposition is preferably performed by stirring the complex compound in a reaction medium mainly containing the amines. The thermal decomposition may be performed in a temperature range in which coated silver nano-particles (or coated metal nano-particles) are formed, but from the viewpoint of preventing the elimination of the amine from the surfaces of silver particles (or from the surfaces of metal particles), the thermal decomposition is preferably performed at a temperature as low as possible within such a temperature range. In case of the complex compound from silver oxalate, the thermal decomposition temperature may be, for example, about 80° C. to 120° C., preferably about 95° C. to 115° C., more specifically about 100° C. to 110° C. In case of the complex compound from silver oxalate, heating at about 100° C. allows decomposition and reduction of silver ions to occur so that coated silver nano-particles can be obtained. Further, the thermal decomposition of silver oxalate itself generally occurs at about 200° C. The reason why the thermal decomposition temperature of a silver oxalate-amine complex compound is about 100° C. lower than that of silver oxalate itself is not clear, but it is estimated that a coordination polymer structure formed by pure silver oxalate is broken by forming a complex compound of silver oxalate with the amine.

Further, the thermal decomposition of the complex compound is preferably performed in an inert gas atmosphere such as argon, but may be performed in the atmosphere.

When the complex compound is thermally decomposed, a suspension exhibiting a glossy blue color is obtained. Then, the excess amines, etc. are removed from the suspension by, for example, sedimentation of silver nano-particles (or metal nano-particles) and decantation and washing with an appropriate solvent (water or an organic solvent) to obtain desired stable coated silver nano-particles (or coated metal nano-particles) [silver nano-particle post-treatment step]. After the washing, the coated silver nano-particles are dried to obtain a powder of the desired stable coated silver nano-particles (or coated metal nano-particles). However, wet silver nano-particles may be used to prepare silver nanoparticle-containing ink.

The decantation and washing are performed using water or an organic solvent. Examples of the organic solvent that may be used include aliphatic hydrocarbon solvents such as pentane, hexane, heptane, octane, nonane, decane, undecane, dodecane, tridecane, and tetradecane; alicyclic hydrocarbon solvents such as cyclohexane; aromatic hydrocarbon solvents such as toluene, xylene, and mesitylene; alcohol solvents such as methanol, ethanol, propanol, and butanol; acetonitrile; and mixed solvents of them.

The step of forming the silver nano-particles according to the present invention does not require the use of a reducing agent. Therefore, a by-product derived from a reducing agent is not formed, coated silver nano-particles are easily separated from a reaction system, and high-purity coated silver nano-particles are obtained. However, if necessary, an appropriate reducing agent may be used without impairing the effects of the present invention.

In this way, silver nano-particles whose surfaces are coated with a protective agent used are formed. The protective agent comprises, for example, the aliphatic monoamine (A), and further one or both of the aliphatic monoamine (B) and the aliphatic diamine (C), and further if used, the carboxylic acid (D). The ratio among/between them contained in the protective agent is the same as the ratio among/between them used in the amine mixture liquid. The same goes for the metal nano-particles.

Then, the silver nano-particles formed in such a manner as described above are dispersed in a dispersion solvent (dispersion medium) containing 50 to 90% by weight of an alcohol-based solvent and 10 to 50% by weight of an aliphatic hydrocarbon-based solvent to prepare a dispersion liquid containing silver nano-particles.

The alcohol-based dispersion solvent used in the present invention is not particularly limited, and may be an aliphatic alcohol selected from a linear alcohol, a branched alcohol, and a ring structure-containing alcohol. Examples of the aliphatic alcohol include: linear or branched aliphatic alcohols such as methanol, ethanol, n-propanol, isopropanol, n-butanol, isobutanol, sec-butanol, tert-butanol, n-pentanol, n-hexanol, 2-ethylhexanol, n-heptanol, n-octanol, n-nonanol, n-decanol, undecanol, and dodecanol; and cyclic (or ring structure-containing) aliphatic alcohols such as cyclopentanol, cyclohexanol, and cyclohexanemethanol. As the alcohol-based dispersion solvent, a saturated compound having no unsaturated bond is appropriately used.

The alcohol-based solvent well disperses the silver nano-particles. When the alcohol-based solvent is used as a main component of the dispersion solvent, a silver conductive layer obtained by calcining the dispersion liquid containing silver nano-particles applied onto a substrate can have a smooth surface. Further, the vapor pressure at ordinary temperature (15 to 25° C.) of the alcohol-based solvent is lower by about one order of magnitude than that of an aliphatic hydrocarbon solvent similar in boiling point. This is considered due to hydrogen bonding in alcohol. Since the alcohol-based solvent has a low vapor pressure, the use of the alcohol-based solvent as a main component of the dispersion solvent suppresses the volatility of the whole dispersion solvent. This is preferred in that when the dispersion liquid containing silver nano-particles is used as ink for various printing, the ink is nonvolatile.

For example, the vapor pressure of cyclohexanemethanol (bp: 181° C.) is 0.034 kPa at 25° C., and the vapor pressure of decalin (bp: 190° C.) having almost the same boiling point is 0.31 kPa at 25° C.

Among them, aliphatic alcohols having 4 or more carbon atoms are preferred in consideration of the nonvolatility of the solvent, and aliphatic alcohols having 4 or more and 12 or less carbon atoms are preferred, such as n-butanol (bp: 117° C.), isobutanol (bp: 108° C.), sec-butanol (bp: 99.5° C.), tert-butanol (bp: 83° C.), n-pentanol (bp: 138° C.), cyclopentanol (bp: 140° C.), n-hexanol (bp: 157.47° C.), 2-ethylhexanol (bp: 183.5° C.), cyclohexanol (bp: 163° C.), cyclohexanemethanol (bp: 181° C.), n-heptanol (bp: 176° C.), n-octanol (bp: 195.28° C.), n-nonanol (bp: 215° C.), n-decanol (bp: 230° C.), undecanol (bp: 250° C.), and dodecanol (bp: 261° C.). More preferred are aliphatic alcohols having 6 or more and 12 or less carbon atoms. Even more preferred are ring structure-containing alcohols containing a six-membered ring structure.

The ring structure-containing alcohol is more compact in molecular size and has a higher boiling point than a chain alcohol having the same carbon number. For example, n-hexanol has a by of 157.47° C., whereas cyclohexanol has a by of 163° C., and n-heptanol has a by of 176.81° C., whereas cyclohexanemethanol has a bp of 181° C.

The use of the ring structure-containing alcohol makes it possible to better disperse the silver nano-particles whose surfaces are coated with an amine protective agent having a short carbon chain. It is estimated that the ring structure-containing alcohol is sterically more compact than a chain hydrocarbon, and therefore easily flows into gaps between agglomerated particles and has the function of loosening agglomerated particles. The above-mentioned alcohols may be used singly or in combination of two or more of them.

The aliphatic hydrocarbon-based dispersion solvent used in the present invention is nonpolar and is not particularly limited, and may be an aliphatic hydrocarbon selected from a linear hydrocarbon, a branched hydrocarbon, and a ring structure-containing hydrocarbon (alicyclic hydrocarbon). Examples of the aliphatic hydrocarbon include n-pentane, n-hexane, n-heptane, n-octane, n-nonane, n-decane, n-undecane, n-dodecane, n-tridecane, and n-tetradecane, and branched isomers thereof. Preferred are aliphatic hydrocarbons having about 5 to 14 carbon atoms. The aliphatic hydrocarbon-based solvent well disperses the silver nano-particles.

Although established, the "alicyclic hydrocarbon" refers to a carbocyclic compound other than an aromatic compound, which contains only carbon and hydrogen. The alicyclic hydrocarbon includes a cycloalkane having a saturated carbon ring, and a cycloalkene and a cycloalkyne whose carbon rings have an unsaturated bond; and further includes a compound having a monocyclic or polycyclic (e.g., bicyclic or tricyclic) structure. In the present invention, the alicyclic hydrocarbon is liquid at ordinary temperature (25° C.), and is, for example, a compound containing a six- to twelve-membered ring structure. The alicyclic hydrocarbon is preferably a compound containing a six-membered ring structure.

Examples of the alicyclic hydrocarbon containing a six-membered ring structure include cyclohexanes, a terpene-based six-membered ring compound, and decalin.

Examples of the cyclohexanes include cyclohexane (boiling point (bp): 80.7° C.); cyclohexanes substituted with a lower alkyl group having 1 to 6 carbon atoms such as methylcyclohexane (bp: 100.4° C.), ethylcyclohexane (bp: 132° C.), n-propylcyclohexane (bp: 157° C.), isopropylcyclohexane (bp: 151° C.), n-butylcyclohexane (bp: 180° C.), isobutylcyclohexane (bp: 169° C.), sec-butylcyclohexane (bp: 179° C.), and tert-butylcyclohexane (bp: 171° C.); and bicyclohexyl (bp: 227° C.)

Examples of the terpene-based six-membered ring compound include monocyclic monoterpenes such as α-pinene (bp: 155 to 156° C.), β-pinene (bp: 164 to 166° C.), limonene (bp: 175.5 to 176° C., 763 mmHg° C.), α-terpinene (bp: 173.5 to 174.8° C., 755 mmHg), β-terpinene (bp: 173 to 174° C.), γ-terpinene (bp: 183° C.), and terpinolene (bp: 186° C.).

Examples of the alicyclic hydrocarbon containing a ring structure other than a six-membered ring structure include cycloheptane (bp: 118 to 120° C.), cycloheptene (bp: 115° C.), cyclooctane (bp: 148 to 149° C., 749 mmHg), cyclooctene (bp: 145 to 146° C.), cyclodecane (bp: 201° C.), and cyclododecene (bp: 241° C.)

Cyclododecane (melting point: 63° C.) is solid at ordinary temperature, but may be used by dissolving in the above-listed alicyclic hydrocarbon that is liquid at ordinary temperature.

Examples of the compound having a polycyclic structure include decalin [(cis form, bp: 195.7° C.; trans form, 185.5° C.)] and bicyclo[2,2,2]octane (bp: 169.5 to 170.5 mmHg).

Among them, cyclohexanes substituted with an alkyl group having 3 to 4 carbon atoms, such as n-propylcyclohexane, isopropylcyclohexane, and n-butylcyclohexane; terpene-based compounds such as limonene and terpinene; and compounds having a polycyclic structure, such as decalin, are preferred.

The alicyclic hydrocarbon is more compact in molecular size and has a higher boiling point than a chain hydrocarbon having the same carbon atoms. For example, cyclohexane has a by of 80.7° C., whereas n-hexane has a by of 69° C. Incidentally, 1-hexanol has a by of 157.47° C. Cyclooctane has a by of 148 to 149° C. (749 mmHg), whereas n-octane has a by of 125.7° C. Incidentally, 1-octanol has a by of 195.28° C.

The use of the alicyclic hydrocarbon as the aliphatic hydrocarbon-based solvent makes it possible to better disperse the silver nano-particles whose surfaces are coated with an amine protective agent having a short carbon chain. It is estimated that the alicyclic hydrocarbon is sterically more compact than a chain hydrocarbon, and therefore easily flows into gaps between agglomerated particles and has the function of loosening agglomerated particles. The above-mentioned aliphatic hydrocarbons may be used singly or in combination of two or more of them.

The mixed dispersion solvent used in the present invention contains the alcohol-based solvent and the aliphatic hydrocarbon-based solvent. When having a relatively high boiling point, the alcohol-based solvent and/or the aliphatic hydrocarbon-based solvent used are/is less likely to volatilize at an ambient temperature (e.g., at 10 to 30° C., or at about ordinary temperature (15 to 25° C.) at which the dispersion liquid ink containing silver nano-particles is used. Therefore, even when the silver nanoparticle-containing ink is used for ink-jet printing, clogging of an ink-jet head does not occur. If the volatility of the dispersion solvent is high, the concentration of the silver nanoparticle-containing ink gradually increases in an environment where the ink is used so that clogging of an ink-jet head is likely to occur. Further, even in other printing methods other than ink-jet printing, high volatility of the dispersion solvent is not preferred.

From such a viewpoint, in the present invention, it is preferred that a ring structure-containing alcohol is used as the alcohol-based solvent and/or an alicyclic hydrocarbon is used as the aliphatic hydrocarbon-based solvent. However, when a solvent having too high a boiling point is used to suppress volatility, conductive performance is less likely to be achieved unless calcining is performed at high temperatures. In this regard, caution should be taken.

As described above, the vapor pressure at ordinary temperature of the alcohol-based solvent is lower by about one order of magnitude than that of an aliphatic hydrocarbon solvent similar in boiling point, and therefore the volatility of the whole dispersion solvent is suppressed. Therefore, the alcohol-based solvent can contribute to suppression of the volatility of the whole dispersion solvent and reduction in the temperature of calcining.

In consideration of the above, the mixed dispersion solvent used in the present invention contains:
the alcohol-based solvent in an amount of 50 to 90% by weight; and
the aliphatic hydrocarbon-based solvent in an amount of 10 to 50% by weight. When the amount of the alcohol-based solvent is 50% by weight or more, it is easy to obtain the effect of the alcohol-based solvent on smoothing the surface of a silver conductive layer obtained by calcining, and it is easier to obtain the effect of suppressing volatility as compared to an aliphatic hydrocarbon solvent similar in boiling point. On the other hand, the upper limit of the amount of the alcohol-based solvent is 90% by weight or less. If the amount of the alcohol-based solvent exceeds 90% by weight, the amount of the aliphatic hydrocarbon-based solvent is less than 10% by weight, which makes it difficult to obtain the effect of the aliphatic hydrocarbon-based solvent on improving dispersibility. Depending on the types of alcohol-based solvent and aliphatic hydrocarbon-based solvent used, the mixed dispersion solvent preferably contains:
the alcohol-based solvent in an amount of 60 to 90% by weight; and
the aliphatic hydrocarbon-based solvent in an amount of 10 to 40% by weight.

The total amount of both the alcohol-based solvent and the aliphatic hydrocarbon-based solvent may be 100% by weight, or another organic solvent may further be used in combination as the balance as long as the objects of the present invention are not adversely affected. Examples of such another organic solvent include aromatic hydrocarbon solvents such as toluene, xylene, and mesitylene.

The powder of coated silver nano-particles in a dry or wet state obtained in the silver nano-particle post-treatment step and the above dispersion solvent are mixed together with stirring so that dispersion liquid containing suspended silver nano-particles can be prepared. The amount of the silver nano-particles contained in the dispersion liquid containing silver nano-particles depends on the intended use, but is, for example, 10% by weight or more, 25% by weight or more, preferably 30% by weight or more. The upper limit of the content of the silver nano-particles is 80% by weight or less as a standard. The mixing and dispersing of coated silver nano-particles and the dispersion solvent may be performed at one time or several times.

The dispersion liquid containing silver nano-particles (ink) obtained in the present invention has excellent stability. The silver ink is stable at a silver concentration of, for example, 50% by weight under cold conditions (e.g., at 5° C. or less) for 1 month or more without the occurrence of agglomeration and fusion.

The prepared dispersion liquid containing silver nano-particles is applied onto a substrate and is then calcined.

The application can be performed by a known method such as spin coating, ink-jet printing, screen printing, dispenser printing, relief printing (flexography), dye sublimation printing, offset printing, laser printer printing (toner printing), intaglio printing (gravure printing), contact printing, or microcontact printing. When a solvent that is less likely to volatilize at about an ambient temperature at which the silver nano-ink is used (e.g., at ordinary temperature (25° C.)) is selected as the mixed dispersion solvent in the silver nanoparticle-containing ink according to the present invention, the silver nanoparticle-containing ink is suitable for ink-jet printing applications. By using such a printing technique, a patterned silver ink coating layer is obtained, and a patterned silver conductive layer is obtained by calcining.

The calcining can be performed at 200° C. or less, for example, a room temperature (25° C.) or more and 150° C. or less, preferably a room temperature (25° C.) or more and 120° C. or less. However, in order to complete the sintering of silver by short-time calcining, the calcining may be performed at a temperature of 60° C. or more and 200° C. or less, for example, 80° C. or more and 150° C. or less, preferably 90° C. or more and 120° C. or less. The time of calcining may be appropriately determined in consideration of the amount of a silver ink applied, the calcining temperature, etc., and may be, for example, several hours (e.g., 3 hours, or 2 hours) or less, preferably 1 hour or less, more preferably 30 minutes or less, even more preferably 10 minutes to 20 minutes.

The silver nano-particles have such a constitution as described above, and are therefore sufficiently sintered even by such low-temperature and short-time calcining. As a result, excellent conductivity (low resistance value) is developed. A silver conductive layer having a low resistance value (e.g., 10 µΩcm or less, in the range of 3 to 10 µΩcm) is formed. The resistance value of bulk silver is 1.6 µΩcm.

Since the calcining can be performed at a low temperature, not only a glass substrate or a heat-resistant plastic substrate such as a polyimide-based film but also a general-purpose plastic substrate having low heat resistance, such as a polyester-based film, e.g., a polyethylene terephthalate (PET) film and a polyethylene naphthalate (PEN) film, or a polyolefin-based film, e.g., polypropylene film, can be suitably used as a substrate. Further, short-time calcining reduces the load on such a general-purpose plastic substrate having low heat resistance, and improves production efficiency.

Further, the silver nanoparticle-containing ink according to the present invention uses the mixed dispersion solvent containing the alcohol-based solvent and the aliphatic hydrocarbon-based solvent in a specific ratio, and therefore can achieve an extremely good dispersion state. Therefore, a silver conductive layer obtained by application and calcining is excellent in surface smoothness. The calcined silver conductive layer has a center-line surface roughness Ra of, for example, 0.03 µm or less, preferably 0.025 µm or less. The silver conductive layer can have an Ra of, for example, 0.03 µm or less without being subjected to treatment for surface smoothing (e.g., pressing or polishing).

A silver conductive material obtained according to the present invention can be applied to various electronic devices such as electromagnetic wave control materials, circuit boards, antennas, radiator plates, liquid crystal displays, organic EL displays, field emission displays (FEDs), IC cards, IC tags, solar cells, LED devices, organic transistors, condensers (capacitors), electronic paper, flexible batteries, flexible sensors, membrane switches, touch panels, and EMI shields. Particularly, the silver conductive material is effective as an electronic material required to have surface smoothness, such as a gate electrode of a thin film transistor (TFT) in a liquid crystal display.

The thickness of the silver conductive layer may be appropriately determined depending on the intended use. The thickness of the silver conductive layer is not particularly limited, and may be selected from the range of, for example, 5 nm to 10 µm, preferably 100 nm to 5 µm, more preferably 300 nm to 2 µm.

The present invention has been described above with reference mainly to ink containing silver nano-particles, but is applied also to ink containing metal nano-particles containing a metal other than silver.

EXAMPLES

Hereinbelow, the present invention will be described more specifically with reference to examples, but is not limited to these examples.

[Specific Resistance Value of Calcined Silver Film]
The specific resistance value of an obtained calcined silver film was measured by a four-terminal method (Loresta GP MCP-T610). The measuring limit of this device is $10^7$ Ωcm.

[Surface Roughness Ra of Calcined Silver Film]
The center-line surface roughness Ra (µm) of an obtained calcined silver film was measured based on JIS-B-0601 using SURFCORDER ET-4000 (manufactured by Kosaka Laboratory Ltd.).

When having an Ra value of 0.03 µm or less, a calcined silver film generally has a specular surface and is excellent in surface smoothness. The lower limit of Ra is not particularly limited, but is about 0.001 µm as measured after calcining.

Reagents used in Examples and Comparative Example are as follows:
N,N-Dimethyl-1,3-propanediamine (N,N-dimethylaminopropylamine MW: 102.18): reagent manufactured by Tokyo Chemical Industry Co., Ltd.;
n-Butylamine (MW: 73.14): reagent manufactured by Tokyo Chemical Industry Co., Ltd.;
n-Hexylamine (MW: 101.19): reagent manufactured by Tokyo Chemical Industry Co., Ltd.;
n-Octylamine (MW: 129.25): reagent manufactured by Tokyo Chemical Industry Co., Ltd.;
n-Butanol: special grade reagent manufactured by Wako Pure Chemical Industries, Ltd.;
n-Octane: special grade reagent manufactured by Wako Pure Chemical Industries, Ltd.;
Tetradecane: special grade reagent manufactured by Wako Pure Chemical Industries, Ltd.;
Decalin: reagent manufactured by Tokyo Chemical Industry Co., Ltd.;
Cyclohexane methanol: reagent manufactured by Tokyo Chemical Industry Co., Ltd.;
Silver oxalate (MW: 303.78): synthesized from silver nitrate (manufactured by Wako Pure Chemical Industries, Ltd.) and oxalic acid dihydrate (manufactured by Wako Pure Chemical Industries, Ltd.).

Example 1

(Preparation of Silver Nano-Particles)
3.0 g (9.9 mmol) of silver oxalate was charged in a 100-mL flask, and then 4.5 g of n-butanol was added thereto to prepare a n-butanol slurry of silver oxalate. Then, an amine mixture liquid of 8.67 g (118.5 mmol) of n-butylamine, 6.00 g (59.3 mmol) of n-hexylamine, 5.74 g (44.4 mmol) of n-octylamine, 2.75 g (14.8 mmol) of dodecylamine, and 6.05 g (59.3 mmol) of N,N-dimethyl-1,3-propanediamine was added dropwise to the slurry at 30° C. Then, the slurry was stirred at 30° C. for 2 hours to allow a complex forming reaction between silver oxalate and the amines to proceed. After the complex formation, the silver oxalate-amine complex was thermally decomposed by heating at 100° C. to obtain a suspension in which dark blue silver nano-particles were suspended in the amine mixture liquid.

After cooling, 30 g of methanol was added to the obtained suspension with stirring. Then, the silver nano-particles were spun down by centrifugation to remove a supernatant. Then, 9 g of methanol was again added to the silver nano-particles with stirring, and then the silver nano-particles were spun down by centrifugation to remove a supernatant. In this way, wet silver nano-particles were obtained.

(Preparation and Calcining of Silver Nano-Ink)
Then, a n-butanol/n-octane mixed solvent (weight ratio=70/30) was added as a dispersion solvent to the wet silver-nanoparticles with stirring so that a silver concentration was 40% by weight to prepare a dispersion liquid containing silver nano-particles.

The dispersion liquid containing silver nano-particles was applied onto an alkali-free glass plate by spin coating to form a coating film. After being formed, the coating film was rapidly calcined in a fan drying oven at 120° C. for 15 minutes to form a calcined silver film having a thickness of 0.6 μm. The specific resistance value of the obtained calcined silver film was measured by a four-terminal method, and as a result, the calcined silver film exhibited excellent conductivity of 5.4 μΩcm. Further, the surface roughness of the obtained calcined silver film was measured, and as a result, the calcined silver film had a smooth surface with an Ra of 0.002 μm.

Example 2

A dispersion liquid containing silver nano-particles was prepared in the same manner as in Example 1 except that the dispersion solvent used to prepare silver nano-ink was changed to a cyclohexanemethanol/decalin mixed solvent (weight ratio=80/20).

The dispersion liquid containing silver nano-particles was applied onto an alkali-free glass plate by spin coating to form a coating film. After being formed, the coating film was rapidly calcined in a fan drying oven at 120° C. for 15 minutes to form a calcined silver film having a thickness of 0.8 μm. The specific resistance value of the obtained calcined silver film was measured by a four-terminal method, and as a result, the calcined silver film exhibited excellent conductivity of 7.0 μΩcm. Further, the surface roughness of the obtained calcined silver film was measured, and as a result, the calcined silver film had a smooth surface with an Ra of 0.003 μm.

Figure 2:
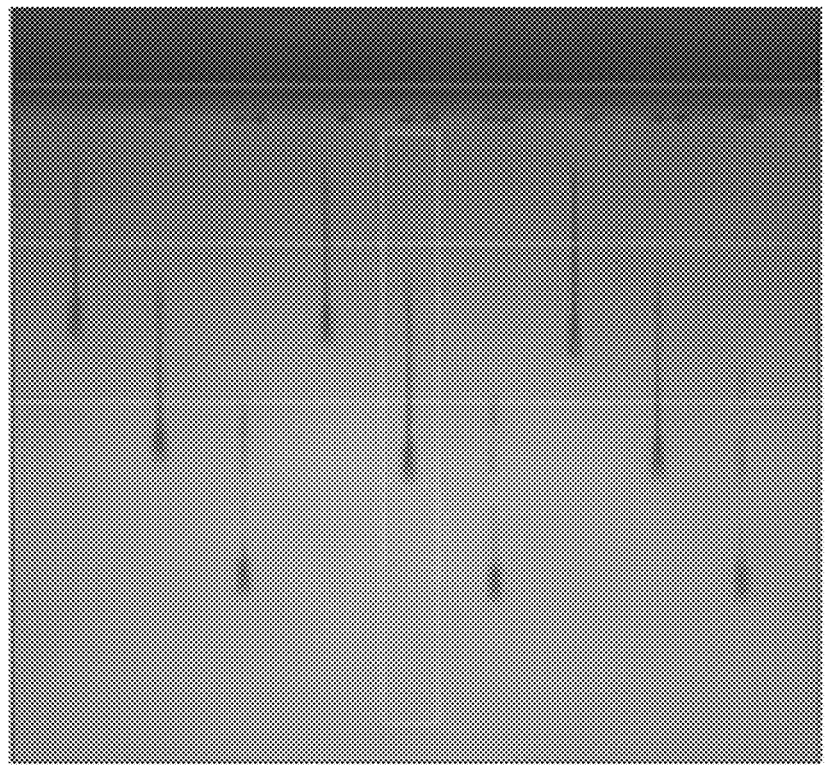
FIG. 2 is a photograph showing an ink-jet ejection state (after 5 minute-intermittent standing) of the silver nanoparticle ink obtained in Example 2.

Further, the dispersion liquid containing silver nano-particles was used for ink-jet printing (ink-jet head KM-512MH manufactured by KONICA MINOLTA, INC.) to evaluate its ink-jet ejection state. It was confirmed that in the initial ejection of the dispersion liquid containing silver nano-particles, the dispersion liquid containing silver nano-particles was well ejected from all the heads (FIG. 1: A photograph showing an initial ejection state). Specifically, FIG. 1 is a photograph taken from the side and showing ink ejection from the ink-jet heads. As can be seen from FIG. 1, ink droplets were well ejected from each of the heads arranged at regular intervals in the horizontal direction of the photograph. Regarding re-ejection after intermittent standing, it was confirmed that when the dispersion liquid containing silver nano-particles was again ejected after 5 minutes from the stop of initial ejection, the dispersion liquid containing silver nano-particles was well ejected from all the heads without the occurrence of nozzle clogging (FIG. 2: A photograph showing an ejection state after 5 minute-intermittent standing).

Example 3

A dispersion liquid containing silver nano-particles was prepared in the same manner as in Example 1 except that the dispersion solvent used to prepare silver nano-ink was changed to a cyclohexanemethanol/tetradecane mixed solvent (weight ratio=70/30).

The dispersion liquid containing silver nano-particles was applied onto an alkali-free glass plate by spin coating to form a coating film. After being formed, the coating film was rapidly calcined in a fan drying oven at 120° C. for 15 minutes to form a calcined silver film having a thickness of 0.8 μm. The specific resistance value of the obtained calcined silver film was measured by a four-terminal method, and as a result, the calcined silver film exhibited excellent conductivity of 9.0 μΩcm. Further, the surface roughness of the obtained calcined silver film was measured, and as a result, the calcined silver film had a smooth surface with an Ra of 0.021 μm.

Figure 3:
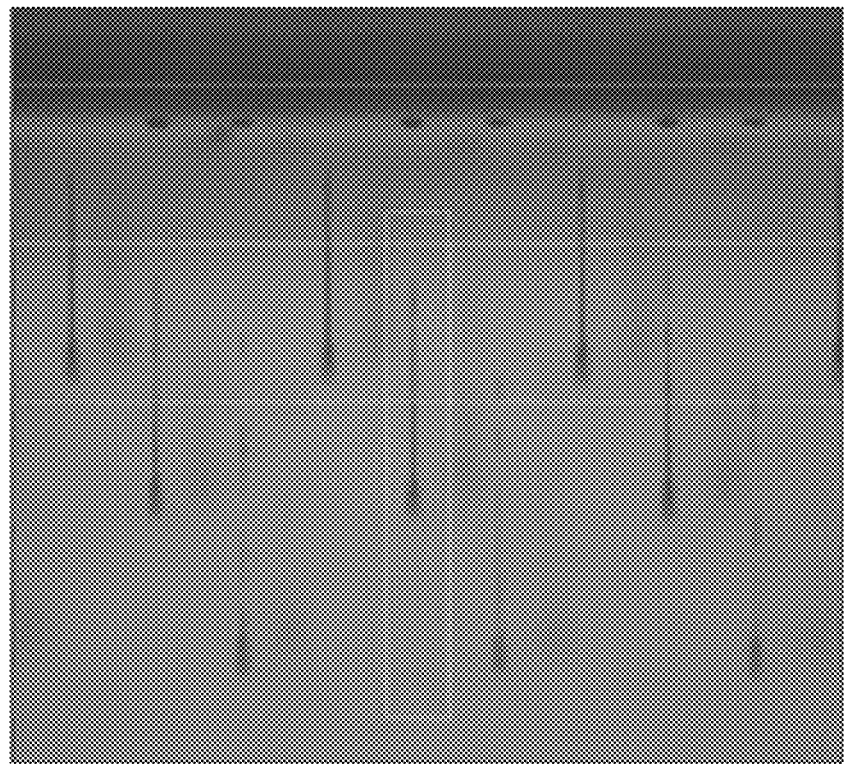
FIG. 3 is a photograph showing an ink-jet ejection state (initial ejection) of the silver nanoparticle ink obtained in Example 3.

Further, the dispersion liquid containing silver nano-particles was used for ink-jet printing (ink-jet head KM-512MH manufactured by KONICA MINOLTA, INC.) to evaluate its ink-jet ejection state. It was confirmed that in the initial ejection of the dispersion liquid containing silver nano-particles, the dispersion liquid containing silver nano-particles was well ejected from all the heads (FIG. 3: A photograph showing an initial ejection state).

Figure 4:
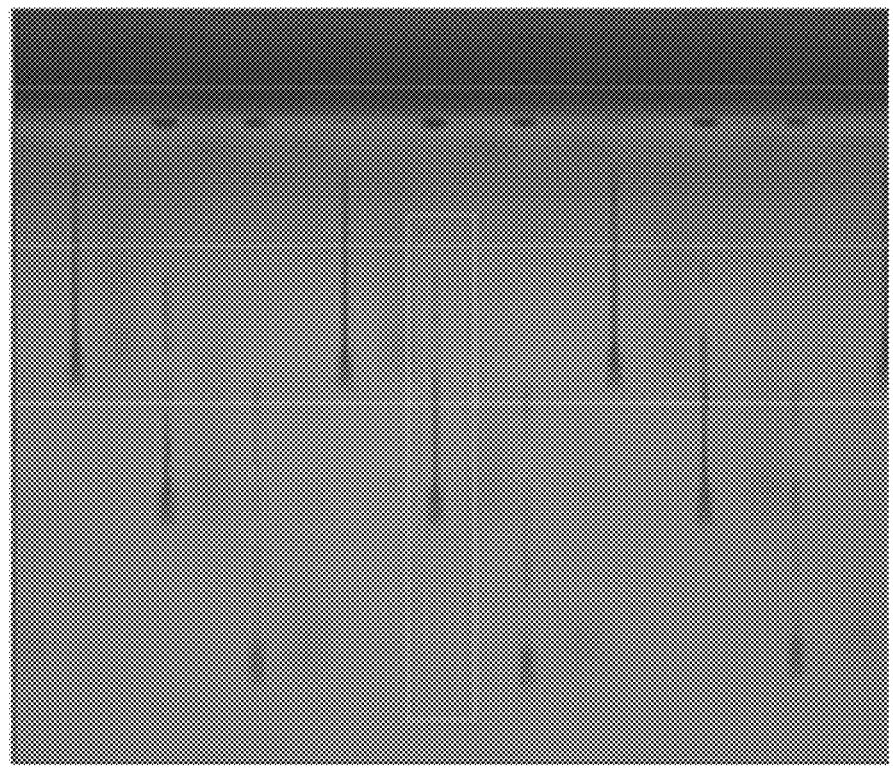
FIG. 4 is a photograph showing an ink-jet ejection state (after 5 minute-intermittent standing) of the silver nanoparticle ink obtained in Example 3.

Regarding re-ejection after intermittent standing, it was confirmed that when the dispersion liquid containing silver nano-particles was again ejected after 5 minutes from the stop of initial ejection, the dispersion liquid containing silver nano-particles was well ejected from all the heads without the occurrence of nozzle clogging (FIG. 4: A photograph showing an ejection state after 5 minute-intermittent standing).

Comparative Example 1

A dispersion liquid containing silver nano-particles was prepared in the same manner as in Example 1 except that the dispersion solvent used to prepare silver nano-ink was changed to a n-butanol/n-octane mixed solvent (weight ratio=30/70).

The dispersion liquid containing silver nano-particles was applied onto an alkali-free glass plate by spin coating to form a coating film. After being formed, the coating film was rapidly calcined in a fan drying oven at 120° C. for 15 minutes to form a calcined silver film having a thickness of 0.5 μm. The specific resistance value of the obtained calcined silver film was measured by a four-terminal method, and as a result, the calcined silver film exhibited excellent conductivity of 4.7 μΩcm. Further, the surface roughness of the obtained calcined silver film was measured, and as a result, the calcined silver film had an Ra of 0.146 μm. The calcined silver film had a white non-specular surface.

The invention claimed is:

1. A dispersion liquid comprising
    silver nano-particles having surfaces coated with a protective agent, and
    a dispersion solvent comprising
    70 to 80% by weight of an alcohol-based solvent wherein the alcohol-based solvent is at least one saturated aliphatic hydrocarbon alcohol selected from the group consisting of n-butanol, isobutanol, sec-butanol, tert-butanol, n-pentanol, n-hexanol, 2-ethylhexanol, n-heptanol, n-octanol, n-nonanol, n-decanol, undecanol, dodecanol, cyclopentanol, cyclohexanol, and cyclohexanemethanol; and
    20 to 30% by weight of an aliphatic hydrocarbon-based solvent that disperses the silver nano-particles,
    wherein the aliphatic hydrocarbon-based solvent is at least one selected from the group consisting of n-pentane, n-hexane, n-heptane, n-octane, n-nonane, n-decane, n-undecane, n-dodecane, n-tridecane, n-tetradecane, branched isomers thereof, isopropylcyclohexane, n-propylcyclohexane, n-butylcyclohexane, limonene, terpinene, and decalin, wherein the protective agent comprises
at least one aliphatic hydrocarbon monoamine (A) comprising an aliphatic hydrocarbon group and one amino group, said aliphatic hydrocarbon group having 6 or more carbon atoms in total;
at least one aliphatic hydrocarbon monoamine (B) selected from the group consisting of n-butylamine, isobutylamine, sec-butylamine, tert-butylamine, isopentylamine, and tertpentylamine, and
at least one aliphatic hydrocarbon diamine (C) comprising an aliphatic hydrocarbon group and two amino groups, wherein aliphatic hydrocarbon diamine (C) is represented by a structural formula:

$R^1R^2N-R-NH_2$ wherein R represents a bivalent alkylene group, $R^1$ and $R^2$ may be the same or different from each other and each represent a methyl or ethyl group, and the total number of carbon atoms of R, $R^1$ and $R^2$ is 6 or less,
wherein an amount of the aliphatic monoamine (A) is from 10 mol % to 60 mol %, an amount of aliphatic monoamine (B) is from 10 mol % to 60 mol %, and an amount of aliphatic diamine (C) is from 10 mol % to 40 mol % based on a total amount of the protective agent, and
wherein the silver nano-particles are contained in an amount of 10% by weight or more.

2. The dispersion liquid according to claim 1, wherein the dispersion liquid is an ink for printing.

3. The dispersion liquid according to claim 1, wherein the dispersion liquid is an ink for ink-jet printing.

4. The dispersion liquid according to claim 1, wherein the saturated aliphatic hydrocarbon alcohol contains a six-membered ring structure.

5. The dispersion liquid according to claim 1, wherein said aliphatic hydrocarbon-based solvent is a member selected from the group consisting of isopropylcyclohexane, n-propylcyclohexane, n-butylcyclohexane, limonene, terpinene, and decalin.

6. The dispersion liquid according to claim 1, wherein the silver nano-particles are contained in an amount of from 30% by weight to 80% by weight.

7. The dispersion liquid according to claim 1, wherein the aliphatic hydrocarbon monoamine (A) is selected from the group consisting of hexylamine, heptylamine, octylamine, nonylamine, decylamine, undecylamine, and dodecylamine.

8. The dispersion liquid according to claim 1, wherein the aliphatic hydrocarbon diamine (C) is selected from the group consisting of N,N-dimethylethylenediamine, N,N-diethylethylenediamine, N,N-dimethyl-1,3-propanediamine, and N,N-dimethyl-1,4-butanediamine.

* * * * *